(12) United States Patent
Crutchfield, Jr. et al.

(10) Patent No.: US 9,514,257 B1
(45) Date of Patent: Dec. 6, 2016

(54) EVENT VISUALIZATION BASED ON UNSTRUCTURED DATA

(75) Inventors: James H. Crutchfield, Jr., Oviedo, FL (US); Leo Salemann, Sammamish, WA (US)

(73) Assignee: Lockheed Martin Corporation, Bethesda, MD (US)

(*) Notice: Subject to any disclaimer, the term of this patent is extended or adjusted under 35 U.S.C. 154(b) by 524 days.

(21) Appl. No.: 13/611,082

(22) Filed: Sep. 12, 2012

Related U.S. Application Data

(60) Provisional application No. 61/553,208, filed on Oct. 30, 2011.

(51) Int. Cl.
*G06F 17/50* (2006.01)

(52) U.S. Cl.
CPC ....... *G06F 17/5022* (2013.01); *G06F 17/5009* (2013.01)

(58) Field of Classification Search
CPC .. G06F 17/5022; G06F 11/261; G06F 11/263; G06F 11/3457; G06F 17/5009; G06F 19/12; G06F 19/26; G06F 3/04815
USPC ......................................................... 707/802
See application file for complete search history.

(56) References Cited

U.S. PATENT DOCUMENTS

| | | | | |
|---|---|---|---|---|
| 5,761,486 A | * | 6/1998 | Watanabe | H04L 43/00 703/21 |
| 6,043,813 A | * | 3/2000 | Stickney | G06T 17/00 345/473 |
| 6,720,949 B1 | * | 4/2004 | Pryor | A63F 13/02 345/156 |
| 2005/0171746 A1 | * | 8/2005 | Thalhammer-Reyero | G05B 17/02 703/2 |
| 2006/0146053 A1 | * | 7/2006 | Gatewood et al. | 345/440 |
| 2007/0146367 A1 | * | 6/2007 | Harvey, Jr. | 345/473 |
| 2007/0261035 A1 | * | 11/2007 | Duneau | G06F 11/3688 717/135 |
| 2008/0114736 A1 | | 5/2008 | Frank et al. | |
| 2009/0096608 A1 | * | 4/2009 | Rehman | 340/572.1 |
| 2009/0287476 A1 | | 11/2009 | Johnson et al. | |
| 2010/0228693 A1 | | 9/2010 | Dawson et al. | |
| 2011/0067002 A1 | * | 3/2011 | Andrews et al. | 717/108 |
| 2011/0202510 A1 | * | 8/2011 | Salemann | G06T 17/05 707/693 |
| 2012/0105451 A1 | * | 5/2012 | Salemann | G06T 17/00 345/424 |
| 2012/0123764 A1 | * | 5/2012 | Ito | G06F 11/3664 703/21 |
| 2012/0221305 A1 | * | 8/2012 | Srivastav | G08G 5/0013 703/6 |

\* cited by examiner

*Primary Examiner* — Merilyn Nguyen
(74) *Attorney, Agent, or Firm* — Withrow & Terranova, PLLC

(57) ABSTRACT

A method, apparatus and computer readable medium for visualizing an event from unstructured data is described, including generating a plurality of structured data units from a plurality of unstructured data, each structured data unit having a time value, an identity value, a location value and a behavior value; and generating a data structure comprising a sequence of the structured data units.

19 Claims, 11 Drawing Sheets

| SDU | IDENTITY | TIME | BEHAVIOR | LOCATION |
|---|---|---|---|---|
| 007 | F-106(1) | 1900 | TAKEOFF | MCCHORD AFB |
| 008 | F-106(2) | 1900 | TAKEOFF | MCCHORD AFB |
| 011 | T-33 | 1900 | REDIRECT | ANG MISSION LOCATION |
| 001 | 727 | 1940 | TAKEOFF | SEATTLE-TACOMA AIRPORT |
| 002 | COOPER | 1940 | TAKEOFF | SEATTLE-TACOMA AIRPORT |
| 003 | SCOTT | 1940 | TAKEOFF | SEATTLE-TACOMA AIRPORT |
| 004 | MUCKLOW | 1940 | TAKEOFF | SEATTLE-TACOMA AIRPORT |
| 005 | RATACZAK | 1940 | TAKEOFF | SEATTLE-TACOMA AIRPORT |
| 006 | ANDERSON | 1940 | TAKEOFF | SEATTLE-TACOMA AIRPORT |
| 009 | F-106(1) | 1940 | FOLLOW | SEATTLE-TACOMA AIRPORT |
| 010 | F-106(2) | 1940 | FOLLOW | SEATTLE-TACOMA AIRPORT |
| 012 | T-33 | 1940 | FOLLOW | SEATTLE-TACOMA AIRPORT |
| 013 | T-33 | 2030 | REDIRECT | OR-CA BORDER |

EVENT VISUALIZATION BASED ON UNSTRUCTURED DATA

RELATED APPLICATIONS

This application claims the benefit of U.S. provisional patent application No. 61/553,208, filed on Oct. 30, 2011, the disclosure of which is hereby incorporated by reference in its entirety for all purposes.

TECHNICAL FIELD

The embodiments relate to generating a simulation of events from unstructured data, such as text.

BACKGROUND

When performing research or other information gathering, oftentimes electronic sources are obtained and reviewed. Such electronic sources include, but are not limited to, news articles, blogs, books, journals, magazines, advertisements, metadata, reports, health records, audios, videos, text-based files, partially text-based files, non-text files, transcripts, briefs, e-mails, or any other sources, documents or informational pieces. Such sources may reside in a public database, private database, accessible over a private network, and/or accessible over a world wide network. Certain of the electronic sources may include unstructured data.

Unstructured data may be data that is not organized or arranged in a data model or data structure. By way of non-limiting example, unstructured data may be data that may be primarily authored, composed, formatted or otherwise arranged so as to be understood or interpreted by a human reader. Unstructured data may be machine readable in some examples, but the content of the unstructured data may not necessarily be formatted to be understood or interpreted as a data model or data structure by the machine. In some examples, prose that may be written or spoken in a human-spoken language, such as English, may be unstructured data, because it may be written to be read and understood by a human reader.

It may be desirable to visualize or otherwise perceive in a simulated environment an event described in unstructured data, wherein the simulated environment may be representative of various environments of the Earth. The event may be described using unstructured data, such as English prose, that may be easily understood as an event by a human, but not structured in a manner that is understandable by a processing device. Accordingly, there is a need for processing unstructured data that represents an event in order to create a data structure representing the event that is understandable by a processing device such as, by way of non-limiting example, a simulator.

SUMMARY

In accordance with the teachings disclosed herein, embodiments related to applications, systems and methods for visualization of an event based on unstructured data are disclosed. Embodiments relate to the processing of unstructured data, such as text, into structured data units that can be interpreted by a processor to create a simulation definition file containing instructions for directing a simulator to generate a visualization of the sequence of structured data units. By way of non-limiting example, a prose account of an aircraft hijacking can be used to generate a data structure having a plurality of events corresponding to the actions of persons and objects described therein, at different times and locations. The data structure can then be used to generate instructions for directing the simulator to generate a visualization of the hijacking described in the prose account.

According to one embodiment, a method is used for visualizing an event from unstructured data. A plurality of structured data units is generated from a plurality of unstructured data. Each structured data unit has a time value, an identity value, a location value and a behavior value. A data structure comprising a sequence of the structured data units is generated. The method may be performed by a device or system, by way of non-limiting example via instructions stored on a computer readable medium.

According to one embodiment, each identity value may identify a person or object, each location value may identify a geolocation or proximity thereto, and/or each behavior value may identify an action, movement, transaction or interaction. According to one embodiment, the data structure comprises an abstract syntax tree.

In another embodiment, a simulation definition file is generated based on the data structure. The simulation definition file contains instructions for directing a simulator to generate a visualization of the sequence of structured data units.

In one embodiment, the simulation definition file is generated by accessing the data structure and processing the structured data units. Processing each structured data unit may include identifying an action based on the behavior value, identifying a person or object based on the identity value, identifying a geolocation based on the location value, or identifying a time based on the time value. Instructions for directing the simulator to generate a visualization of the structured data units are generated based on the identified behaviors, objects, locations and times of the structured data units, and the instructions are stored as the simulation definition file.

According to one embodiment, the plurality of structured data units is generated from the plurality of unstructured data by determining that at least one of a time value, an identity value, a location value and a behavior value for each structured data unit cannot be determined solely based on the unstructured data. In response to this determination, the missing value is estimated based on a secondary data source.

Those skilled in the art will appreciate the scope of the embodiments and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the embodiments, and together with the description serve to explain the principles of the embodiments.

FIG. 6 is a diagram of a data structure according to one embodiment;

DETAILED DESCRIPTION

The embodiments set forth below represent the necessary information to enable those skilled in the art to practice the embodiments and illustrate the best mode of practicing the embodiments. Upon reading the following description in light of the accompanying drawings, those skilled in the art will understand the concepts of the embodiments and will recognize applications of these concepts not particularly addressed herein. It should be understood that these concepts and applications fall within the scope of the embodiments and the accompanying claims.

Figure 1:
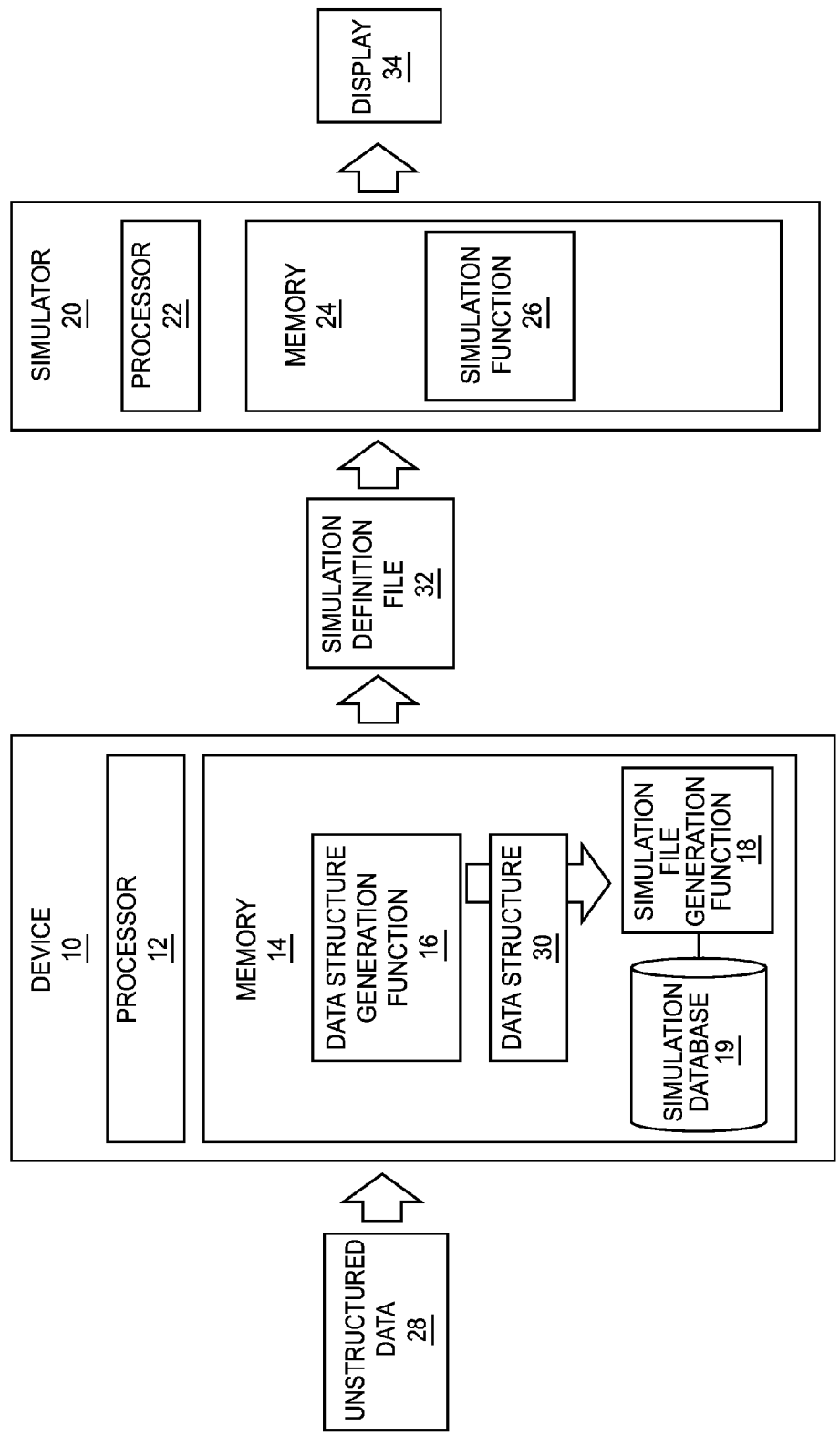
FIG. 1 is a block diagram illustrating a system suitable for practicing embodiments disclosed herein.
Figure 2:
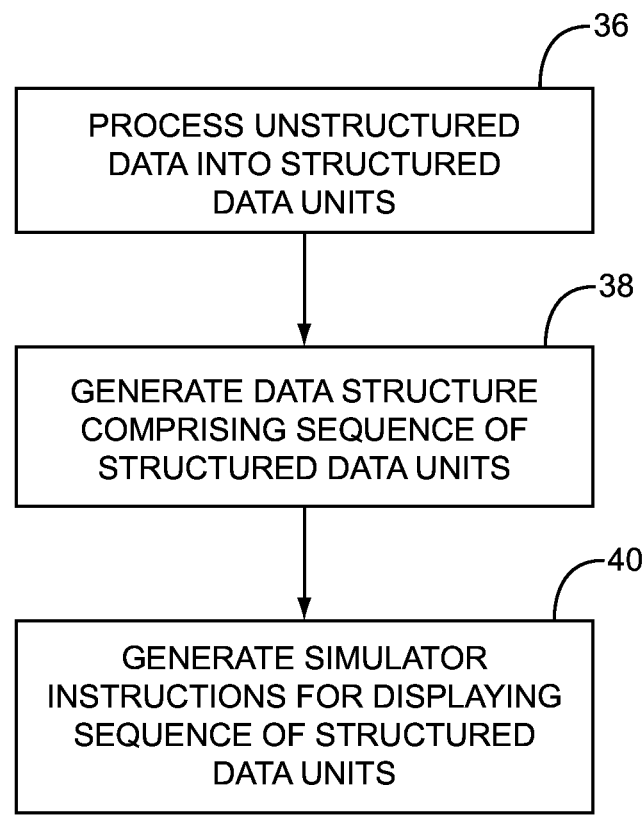
FIG. 2 is a flowchart that illustrates a process for visualizing events from unstructured data according to one embodiment.

FIG. 1 is a block diagram illustrating a system suitable for practicing embodiments disclosed herein. FIG. 2 is a flowchart that illustrates a process for visualizing events from unstructured data according to one embodiment, and will be discussed in conjunction with FIG. 1. A device 10 may comprise a processor 12 and a memory 14. The memory 14 may contain a data structure generation function 16 and a simulation file generation function 18 that implements aspects of the process described herein. The data structure generation function 16 and simulation file generation function 18 may comprise software instructions, circuitry or a combination of both. While for purposes of illustration, functionality described herein may be attributed to the data structure generation function 16 and/or the simulation file generation function 18, it should be apparent that the functionality described herein may be provided by any number of different modules, or functions, depending on a desired implementation. Accordingly, functionality may also be attributed herein to the device 10 without reference to the data structure generation function 16 or the simulation file generation function 18.

In one embodiment, the device 10 reads, receives, or otherwise accesses unstructured data 28. Unstructured data 28 may be data that is not organized or arranged in a data model or data structure. By way of non-limiting example, unstructured data 28 may be data that may be primarily authored, composed, formatted or otherwise arranged so as to be understood or interpreted by a human reader. Unstructured data 28 may be machine readable in some examples, but the content of the unstructured data is not necessarily formatted to be understood or interpreted as a data model or data structure by the machine. In some examples, prose that may be written or spoken in a human-spoken language, such as English, may be unstructured data, because it may be written to be read and understood by a human reader.

The unstructured data 28 may be, by way of non-limiting example, an electronic or other source as described above. Electronic sources may include, by way of non-limiting example, news articles, blogs, books, journals, magazines, advertisements, metadata, reports, health records, audios, videos, text-based files, partially text-based files, non-text files, transcripts, briefs, e-mails, or any other sources, documents or informational pieces. Electronic sources may be stored in a number of different manners, including Unicode, ASCII, HTML, and/or UCS, or other codes. The electronic sources may reside on computer systems on a network, such as the Internet or on a private network, in private or public databases, or elsewhere.

The unstructured data 28 may include data corresponding to different parts of speech, including, but not limited to, nouns and verbs. Non-limiting examples of nouns include objects, locations, and time. Non-limiting examples of verbs include transitory actions, such as movement, or non-transitory states, such as condition or disposition. Non-limiting examples of a data structure include an abstract syntax tree, a parse tree, or any other hierarchical structure that models, or otherwise provides structure to, data.

The data structure generation function 16 parses the unstructured data 28 into a plurality of parsed data units, arranges the plurality of parsed data units into a sequence, and generates a data structure comprising a sequence of structured data units. The data structure generation function 16 may include a geoparser in which geographic identifiers may be assigned to the unstructured data in an electronic source. One example of a commercial geoparser application is Lockheed Martin's LM WISDOM™ geoparser application. Geographic identifiers may include, but are not limited to, geographic coordinates, including but not limited to latitude, longitude, and altitude. Additionally, the data structure generation function may identify keywords describing the "who", "when", "where", and "how" of an event; that is, the keywords may identify identity data, time data, location data, and behavior data associated with an event sequence. An event sequence may relate to a single episode or occurrence or to a series of events having a common nexus. By way of non-limiting example, an event sequence may be a single event or action at a specific time and place, such as the bombing of Pan Am Flight 103, or a series of events or actions, such as all events surrounding or related to the bombing of Pan Am Flight 103 including, but not limited to, take-off of the aircraft, the explosion, and disintegration of the aircraft.

The simulation file generation function 18 uses the data structure 30 and a simulation database 19 to generate a simulation definition file 32 containing instructions for directing a simulator 20 to generate a visualization of the sequence of structured data units. The simulator 20 may comprise a processor 22 and a memory 24. The memory 24 may contain a simulation function 26 that executes the simulation instructions contained in the simulation definition file 32.

Unstructured data 28 may be input into the device 10, where it may be processed by the data structure generation function 16 into a data structure 30 having a plurality of structured data units. The simulation file generation function 18 may cross reference the data structure 30 with the simulation database 19. The simulation database 19 may include displayable objects, behaviors, and locations or geolocations, and may comprise a single database or multiple databases, including by way of non-limiting example, separate object, behavior and location databases corresponding to respective objects, behaviors and locations. By way of non-limiting example, the simulation database 19 may include a plurality of types, models, configurations, etc. of an object, a plurality of behaviors which may be executed by an object, and/or a plurality of locations or landmarks which correspond to geolocations. By way of non-limiting example, if the object is an aircraft, the simulation database 19 may include a plurality of aircraft models as objects, and a plurality of maneuvers for the aircraft as actions. Updating of the simulation database 19 may be made periodically, in real-time, or as desired.

The simulation file generation function 18 then generates instructions capable of directing the simulator 20 to generate a visualization of the sequence of structured data units of the data structure 30. These instructions may be stored in simulation definition file 32.

The simulation definition file 32 may then be input into the simulator 20. The simulation function 26 reads the instructions in the simulation definition file 32 and outputs a visualization of the sequence of structured data units in the data structure 30, by way of non-limiting example, on a display 34. The simulator 20 may comprise, by way of non-limiting example, a computing device that executes simulator software that provides simulations, or may be a special-purpose simulator device. While for purposes of illustration, the term "simulation" may be used herein primarily in the context of a visualization of a virtual environment, the embodiments are not so limited, and are applicable to any type of simulation, whether involving visualization or not, in which it is desirable to process information at locations within a simulated environment.

The flowchart of FIG. 2 illustrates the functions of the device 10 of FIG. 1 as a process. The process may be performed by a single device 10 or by a plurality of interconnected or networked devices 10. First, unstructured data 28 may be processed into structured data units (or events) (block 36). By way of non-limiting example, sentences of a text passage may be parsed into their component parts and associated with identities, times, locations and behaviors, based on the text contents. The structured data units may correspond to events, each having associated time values, identity values, behavior values and location values.

A time value may relate to time(s) set forth in an event. The time value may include a specific time (by way of non-limiting example, 7:40 am), or a range of time (by way of non-limiting example, 7:40 am to 9:00 am, or Jan. 1, 2010 to Dec. 31, 2010).

An identity value may relate to a particular object, person, entity or other identifier. Non-limiting examples of identity values include vehicles, buildings, DIS enumerators, individuals, entities, aircraft, submarines, and weaponry.

A location value may relate to a particular location, region, area of interest, position or other geographic identifier. The location value may be assigned geographic identifiers via geoparsing in order to map the location value in an application.

A behavior value may relate to a particular behavior, action, or other identifier that may be a verb, and may comprise a behavior for the object defined by the identity value to execute. The behavior value may indicate, by way of non-limiting example, movement of an object, stoppage of movement of an object, and direction of an object. The behavior data may map to standard or known behaviors.

Next, a data structure comprising a sequence of structured data units (i.e., events) may be generated (block 38). The sequence may generally correspond to a timeline of events, but may be ordered based on other sorting criteria as well. Finally, simulation instructions for displaying the sequence of events by a simulator may be generated (block 40). Simulation instructions may include Military Simulation Definition Language (MSDL), which may be used with a number of different types of simulation hardware and software, including Warfighter's Simulation (WARSIM), Exportable Computer Generated Forces (ExCGF) and Prepar3D® simulation software. Simulation instructions may also include other programming languages capable of generating simulations.

Figure 3:
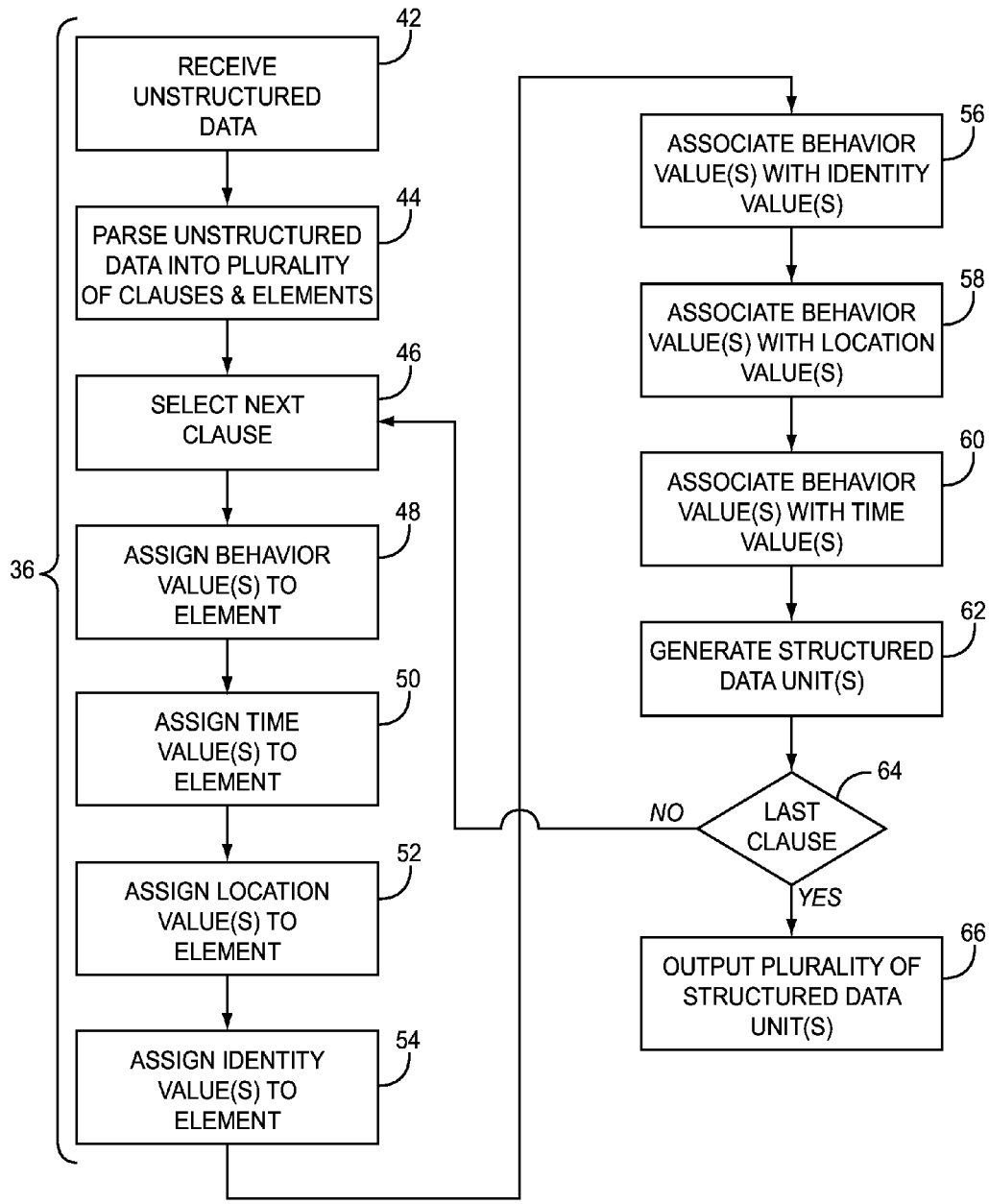
FIG. 3 is a flowchart that illustrates a process for processing unstructured data into structured data units according to one embodiment.

FIG. 3 is a flowchart that illustrates a process for processing unstructured data into structured data units according to one embodiment, by way of non-limiting example, as in block 36 of FIG. 2. Unstructured data, such as prose or other text, may be received (block 42), by way of non-limiting example, via an input interface, a communications interface or other interface as will be described in greater detail below. The unstructured data may then be parsed into a plurality of clauses and elements (such as individual words or phrases) (block 44), such that each clause represents one or more action or event and each element corresponds to a property, such as an identity, time, location and/or behavior, associated with the actions or events. The unstructured data may alternatively be parsed into sentences or any other unit that represents actions or events. In general, each clause will include information relating to different properties of the event, including an identity of a person or object, a behavior performed by the person or object, a time during which the behavior may be performed, and a location where the behavior may be performed. These properties may be expressly set forth in the clause, sentence or unit, and may also be determined or estimated based on the context of the clause, i.e., the properties of the surrounding clauses.

Natural language processing may be used. A non-limiting example for performing natural language processing includes the use of a database comprising standard or known keywords. By way of non-limiting example, a database inclusive of "slang" terms may be used in order to perform natural language processing. In such a manner, although an electronic source may include unstructured data wherein the data includes a term which may be considered "slang", the appropriate associations may still be made so as to display the appropriate objects and/or perform the appropriate behavior.

Each clause may then be processed into one or more structured data units (blocks 46, 48, 50, 52, 54, 56, 58, 60, 62, 64). Blocks 46, 48, 50, 52, 54, 56, 58, 60, 62 and 64 may be arranged as an iterative process, but other types of processes, such as a linear or parallel process, may be used. Beginning with the first clause in the unstructured data, the next clause may be selected (block 46), and then each element of the clause (such as a word or phrase) may be assigned a behavior value (block 48), a time value (block 50), a location value (block 52) and/or an identity value (block 54). In general, nouns will be assigned identity values corresponding to persons, objects, or other tangible things. Nouns may also have location values as well, such as known locations of stationary objects, buildings or landmarks, or location values of objects in motion, such as an aircraft, or persons located on the aircraft. In general, verbs will be assigned behavior values, but may be assigned other types of values instead or in addition, based on the content and context of the unstructured data.

Next, the behavior values of the clause may be associated with identity values (block 56), location values (block 58) and time values (block 60) of the clause. If certain types of values are not explicitly found in the clause itself, the value may be estimated, interpolated, or otherwise determined from the surrounding clauses, or from an external data source, including additional unstructured data such as text, or structured data such as an external rule set. Thus, one or more structured data units may be generated from each clause (block 62), each structured data unit having at least one identity, behavior, time and location value.

As an example, the elements of a clause "at 4:30 pm, the aircraft turned southeast toward Reno" may be assigned a time value ("4:30 pm"), an identity ("the aircraft") and a behavior ("turned southeast toward Reno"), but the clause contains only partial information relating to the specific location for the event. The specific location for this event may be determined in a number of different ways. In one example, information from previous clauses that identify previous locations, airspeed, and course headings may be used to estimate the aircraft's location at 4:30 when the aircraft makes the turn. The behavior "turned southeast toward Reno" can also be used to determine location, since it follows that the aircraft would be northwest of Reno when the aircraft makes the turn. By using a number of parsing, logic, interpolation and other techniques, clauses containing only partial information relating to an event may be processed into complete structured data units.

When it is determined that the last clause has been processed (block 64), the plurality of structured data units may be output (block 66) and a data structure may be generated (block 38, FIG. 2).

Figure 4:
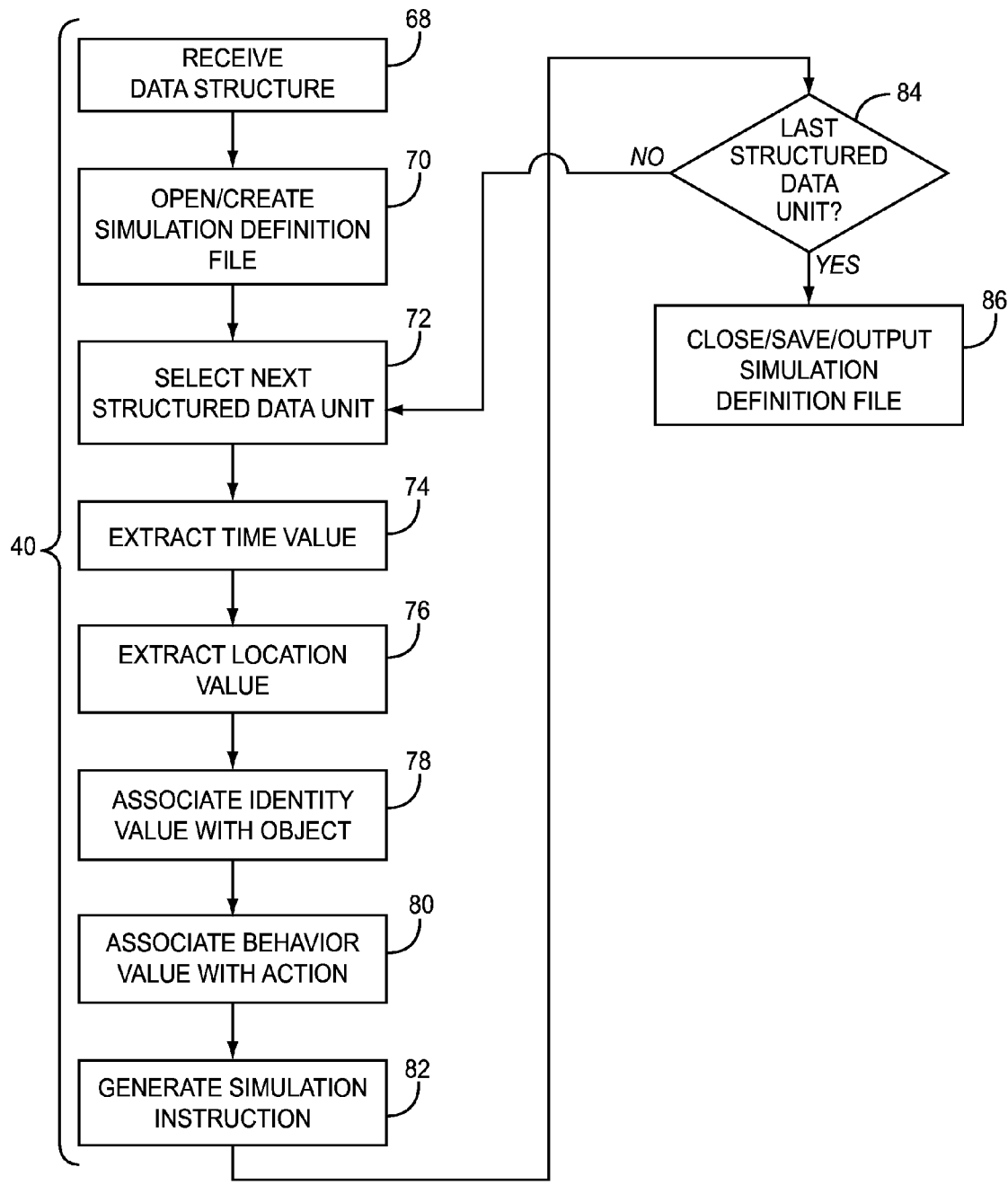
FIG. 4 is a flowchart that illustrates a process for generating simulator instructions for displaying a sequence of events according to one embodiment.

FIG. 4 is a flowchart that illustrates a process for generating simulator instructions for displaying the sequence of events according to one embodiment, by way of non-limiting example, as in block 36 of FIG. 2. The data structure may be received (block 68) and a simulation definition file may be created or opened (block 70). Each structured data unit in the data structure may then be processed into corresponding simulation instructions (blocks 72, 74, 76, 78, 80, 82, 84). Blocks 72, 74, 76, 78, 80, 82 and 84 may be arranged as an iterative process, but other types of processes, such a linear or parallel process may be used. Beginning with the first structured data unit in the data structure, the next structured data unit may be selected (block 72) for processing. The time value and location values may be extracted (blocks 74 & 76). The identity values may then be associated with simulation instruction objects (block 78) and the behavior values may be associated with simulation instruction actions (block 80). By way of non-limiting example, for an identity value "727 airliner," a simulation instruction set may not include a specific object that corresponds exactly to that particular aircraft. However, the simulation instruction set may include a generic mid-sized airliner object, which may be associated with the specific "727 airliner" identity value. The simulation instruction objects and actions, as well as locations and times, may be selected from the simulation database 19 by way of non-limiting example. One or more simulation instructions may then be generated (block 82) for the structured data unit.

When it is determined that the last structured data unit has been processed (block 84), the simulation definition file containing the instruction set for running the simulation may be closed, saved or otherwise output (block 86).

Figure 5A:
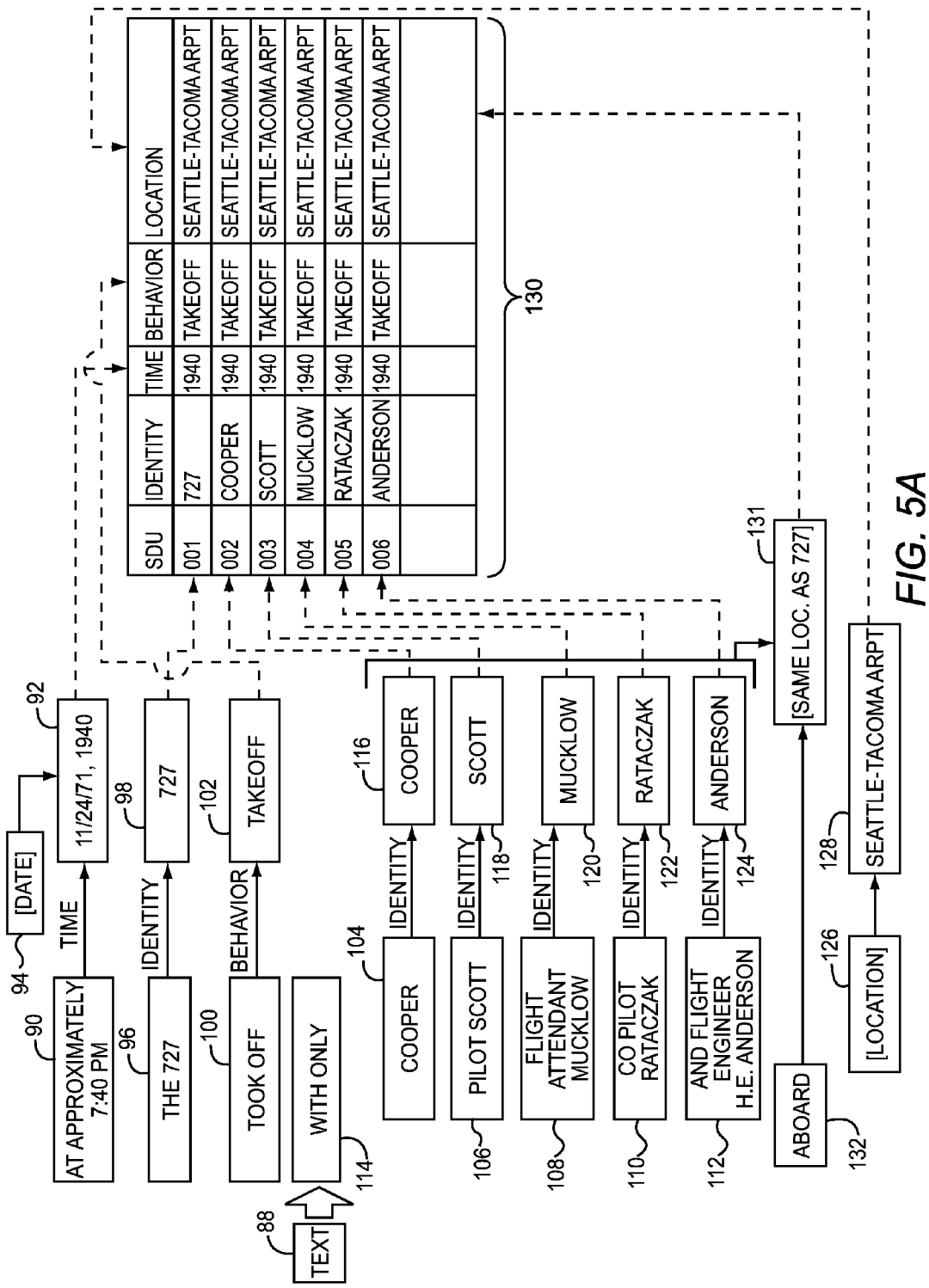
FIGS. 5A-5C are flowcharts that illustrate a process with respect to a passage of unstructured data according to one embodiment.
Figure 5B:
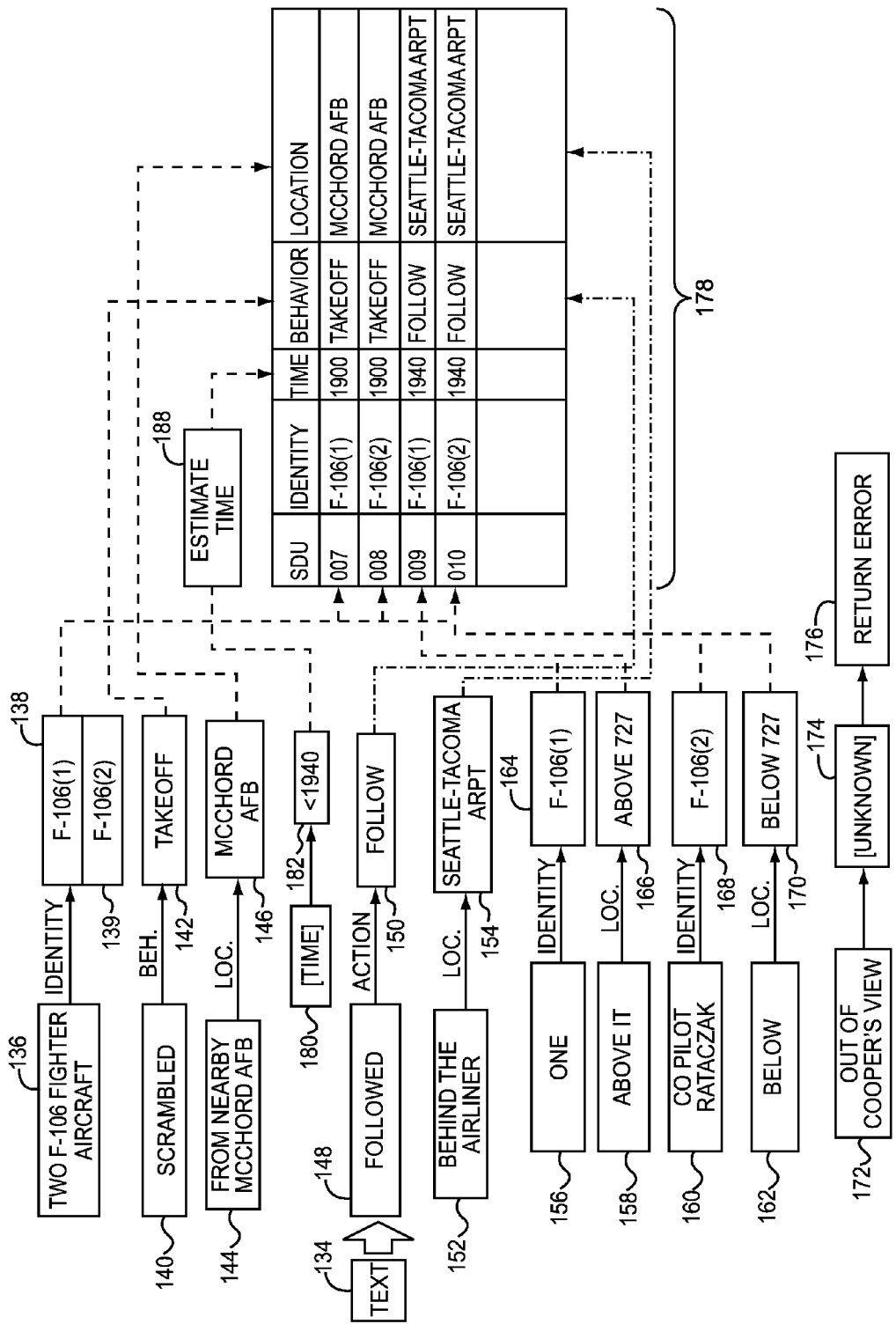
Figure 5C:
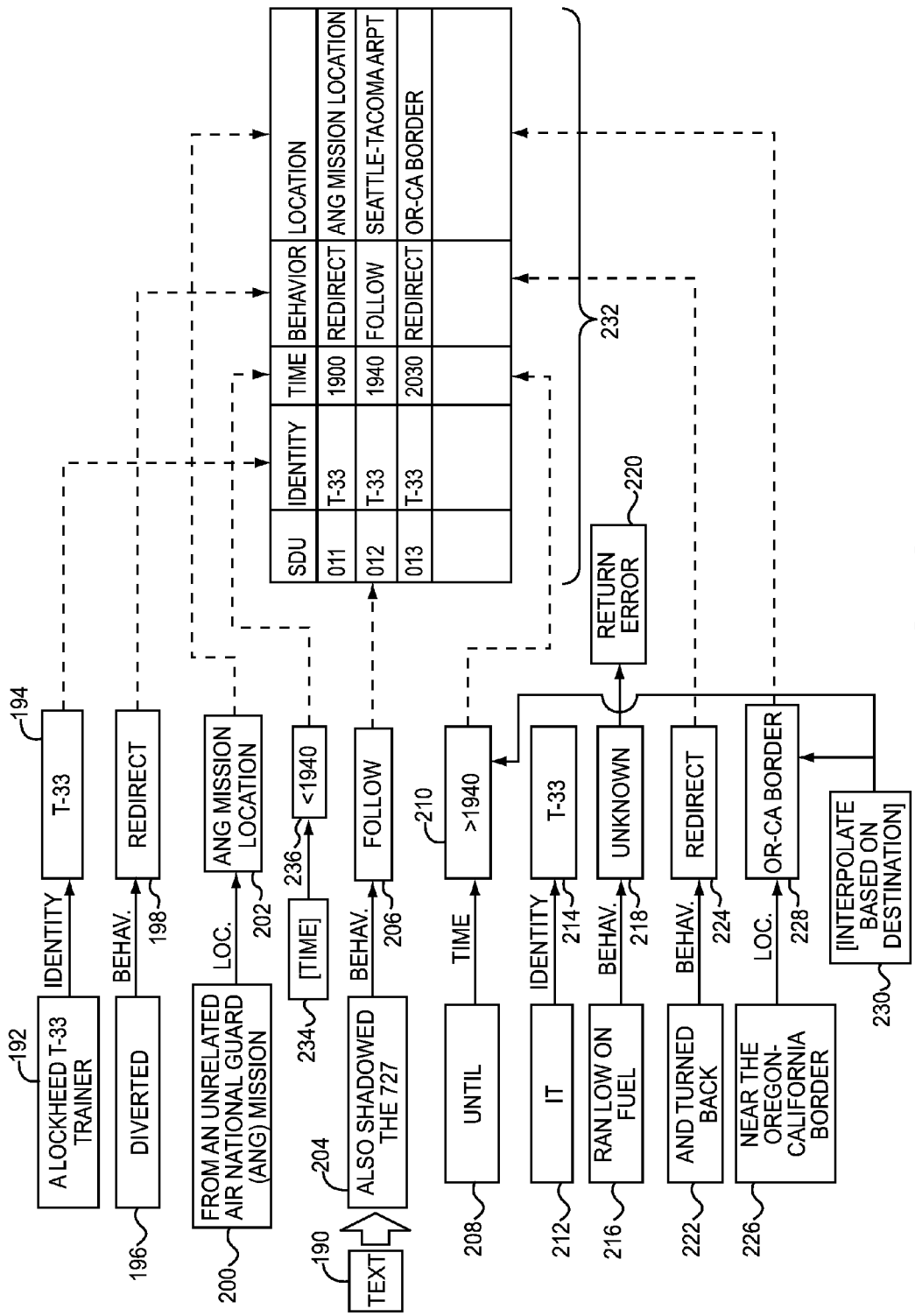

FIGS. 5A-5C are flowcharts that illustrate a process with respect to a passage of unstructured data according to one embodiment. For purposes of illustration, the Wikipedia article entitled "D. B. Cooper" is referred to herein. The full passage from the article that will be used for this example is: "At approximately 7:40 pm the 727 took off with only Cooper, pilot Scott, flight attendant Mucklow, copilot Rataczak, and flight engineer H. E. Anderson aboard. Two F-106 fighter aircraft scrambled from nearby McChord Air Force Base followed behind the airliner, one above it and one below, out of Cooper's view. A Lockheed T-33 trainer, diverted from an unrelated Air National Guard mission, also shadowed the 727 until it ran low on fuel and turned back near the Oregon-California border." The generation of structured data units for each sentence will be described in detail below.

FIG. 5A illustrates the generation of structured data units from the first sentence of the passage. The unstructured data (block 88) may be first parsed into clauses, each having a plurality of individual elements. "At approximately 7:40 p.m.," (block 90) may be assigned a time value (block 92). In this example, the date of the event (Nov. 24, 1971) (block 94) may also be determined and included in the time value (block 92) because the date was previously referenced in a passage of the article. Likewise, "the 727" (block 96) may be assigned an identity value (block 98) and "took off" (block 100) may be assigned a behavior value (block 102). Each passenger within the list of passengers (blocks 104, 106, 108, 110, 112), indicated by "with only" (block 114), may be assigned an identity value (blocks 116, 118, 120, 122, 124). The sentence does not include an explicit location, but, based on a previous passage of the article (block 126), the location may be determined as "Seattle-Tacoma Airport" (block 128) because the location of the aircraft at that point may be referenced in the previous passage (block 126).

Next, the values may be associated with each other to generate a plurality of structured data units (block 130). The behavior value "takeoff" (block 102) may be primarily performed by the "727" (block 98) from "Seattle-Tacoma Airport" (block 128) at "1940 hours, Nov. 24, 1971" (block 92). Accordingly, the structured data unit (SDU) 001 may be entered into block 130 with corresponding behavior, identity, time, and location values. The additional identity values (blocks 116, 118, 120, 122, 124) may be determined to have the same behavior, time and location values (block 131) as the "727" (block 98) based on the contextual term "aboard" (block 132). Thus, SDUs 002-006 may be entered into block 130 and may include these passenger identity values (blocks 116, 118, 120, 122, 124), along with their corresponding behavior, time and location values. Alternatively, the location values associated with the passengers' identity values (blocks 116, 118, 120, 122, 124) may instead refer to the vehicle in which the passengers may be travelling, i.e., the 727. A location value "727" may then be associated with the actual geolocation value of the 727, i.e., "Seattle-Tacoma Airport," thereby linking the locations of the passengers to the location of the vehicle at any point in time while they are aboard the aircraft.

Turning now to FIG. 5B, the generation of structured data units from the next sentence of the passage is illustrated. Similar to FIG. 5A, the unstructured data (block 134) may be first parsed into clauses, each having a plurality of individual elements. The phrase "Two F-106 fighter aircraft" (block 136) may be assigned a pair of identity values, one for each aircraft (blocks 138 and 139). Dependent clause "scrambled from nearby McChord Air Force Base" may be parsed as a separate clause into two elements: "scrambled" (block 140), which may be assigned a behavior value (block 142); and "from nearby McChord Air Force Base" (block 144), which may be assigned a location value (block 146). The term "followed" (block 148) may be assigned a behavior value (block 150), and the phrase "behind the airliner" (block 152) may be assigned a location value (block 154) based on the known location of the 727 (see FIG. 5A). The terms "one above it and one below" are parsed into units (blocks 156, 158, 160, 162) and may be assigned identity and location values (blocks 164, 166, 168, 170) corresponding to the locations of the two F-106 aircraft with respect to the 727 airliner. In this example, the term "out of Cooper's view" (block 172) may not be recognized (block 174) and may return an error message (block 176) and/or be labeled as "Unknown."

Next, as in FIG. 5A, the values may be associated with each other to generate a plurality of structured data units (block 178). The behavior value "takeoff" (block 142) may be performed by both F-106 aircraft (blocks 138, 140) from "McChord AFB" (block 146). Although no specific takeoff time may be mentioned in the clause, a takeoff time range (block 180) may be known to be prior to 7:40 p.m. (block 182) from the sentence context. A specific time value may be estimated (block 188) based on, by way of non-limiting example, the distance from McChord Air Force Base, the average cruising airspeed of an F-106 aircraft, or other known criteria. In this example, the time may be estimated as 1900 hours (i.e., 7:00 p.m.). Accordingly, SDU 007 and 008 may be entered into block 178 with the corresponding behavior, time and location values for each F-106 aircraft. Next, the F-106 aircraft each perform a second behavior "follow" (block 150) ("above the 727" (block 166) and "below the 727" (block 170), respectively) at a later time and location. In context, it may be determined that the time and location values for SDUs 007 and 008 may be the same as the 727 aircraft at takeoff, i.e., "1940 hours" at "Seattle-Tacoma Airport." Thus, SDU 009 and 010 may be entered into block 178 and include identity values for the two F-106 aircraft (blocks 138 and 140), along with their corresponding behavior, time and location values.

Referring now to FIG. 5C, the generation of structured data units from the last sentence of the passage is illustrated. Similar to FIGS. 5A and 5B, the unstructured data (block 190) may first be parsed into clauses, each having a plurality of individual elements. "A Lockheed T-33 Trainer" (block 192) may be assigned an identity value (block 194). Dependent clause "diverted from an unrelated National Guard mission" may be parsed as a separate clause into two elements: "diverted" (block 196), which may be assigned a behavior value (block 198); and "from an unrelated National Guard mission" (block 200), which may be assigned a location value (block 202) based on an estimated location of the National Guard mission, by way of non-limiting example, derived from an external data source. The term "also shadowed the 727" (block 204) may be assigned a behavior value (block 206). The term "until" (block 208) indicates a time after the shadowing began, but does not indicate a specific time.

Two dependent clauses follow. The first clause may be separated into "it," (block 212) assigned an identity value (block 214) based on its antecedent, and "ran low on fuel," (block 216) which may not be recognized (block 218) and may return an error message (block 220) and/or be labeled as "Unknown.". The second clause begins with the phrase "and turned back" (block 222), which may be assigned a behavior value (block 224), and ends with "near the Oregon-California border" (block 226) which may be assigned a range of values (block 228) or alternatively, may be assigned a specific location value by interpolating or otherwise estimating the location along the Oregon-California border (block 230) using additional information from the text or from other data sources. Likewise, a specific time value at which the T-33 Lockheed Trainer turns back may also be interpolated or otherwise estimated (block 230) using similar techniques.

Next, as in FIGS. 5A and 5B, the values may be associated with each other to generate a plurality of structured data units (block 232). The T-33 Lockheed trainer performs three behaviors at three different times. The time and location of the "follow" behavior may be determined from the text, and the time and location of the two "redirect" behaviors may be estimated in this example, to generate SDU 011-013 (block 232). As in FIGS. 5A and 5B, the times when the redirection toward the 727 and the redirection back to Seattle take place may be estimated (blocks 210, 234, 236, 232) based on the unstructured data and/or on external data sources.

FIG. 6 is a diagram of a data structure 238 according to one embodiment. In this example, SDU 001-013 described in FIGS. 5A-5C may be arranged in a sequence according to predetermined criteria. In many embodiments, the criteria will specify that the sequence be chronological, as here. However, other types of sequencing are possible, by way of non-limiting example, grouping the data units by identity.

In another embodiment, the data structure may also include additional structured data units corresponding to anticipated behaviors, which may be generated and visualized based upon the generated structured data units. A database of events may be called upon in determining anticipated behaviors wherein correlations between events in a database may be made to the object/location/behavior data. By way of non-limiting example, a stronger correlation between the event in the database and the identity/location/behavior values may result in a generated structured data unit corresponding to an anticipated behavior. Based upon these anticipated behaviors, potential routes, flight paths, and other trajectories may be provided to an end user.

At this stage, the data structure may now be in a form that may be used to generate simulation instructions using the data structure and one or more simulation databases, for execution on a simulator, media player or other device. By way of non-limiting example, in FIG. 1, data structure 30 may be input into the simulation file generation function 18, which uses the data structure 30 and simulation database 19 to generate a simulation definition file 32. A simulation definition file may include instructions for the display of a timeline and may support navigation and playback of the timeline. A simulator, media player or other device may then receive the definition file for playback on a display or a plurality of displays.

It should be recognized that the content of the values, such as identity, location, time and behavior values, need not use the same format, language or terminology as used in the embodiments herein. The values need only be capable of identifying the above-described properties in a manner that enables a simulation file generation function 18 or similar function to generate simulation instructions for recreating the events described by the unstructured data.

Figure 7:
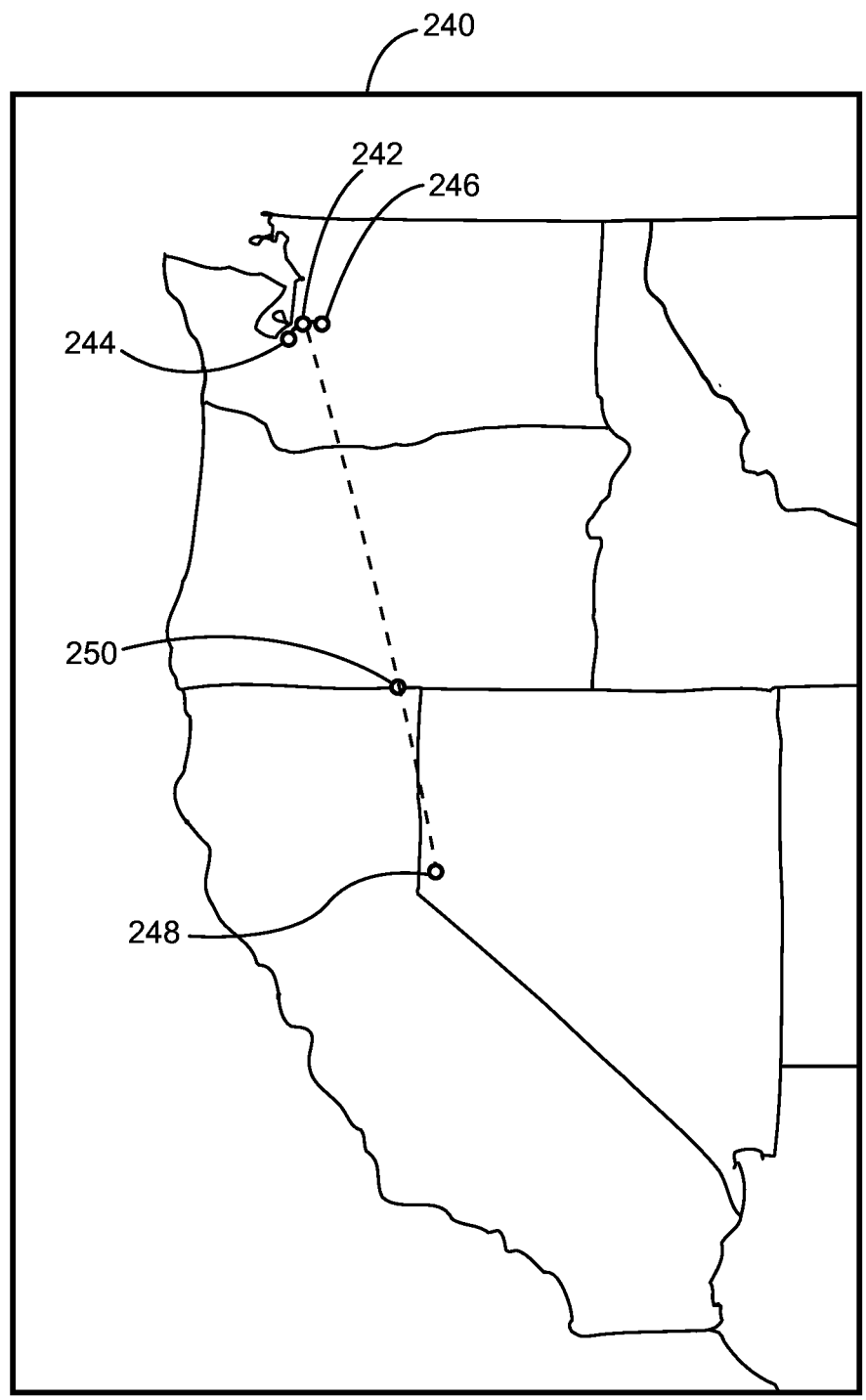
FIG. 7 illustrates a two-dimensional simulation display according to one embodiment.

FIG. 7 illustrates a simulation display according to one embodiment. This two-dimensional overhead map display includes the various locations described above in FIGS. 5A-5C and 6, including Seattle-Tacoma Airport 242, McChord Air Force Base 244, the estimated location of the National Guard mission 246, Reno, Nev. 248 (the eventual destination of the 727 airliner), and the location on the Oregon-California Border 250 where the T-33 turned back toward Washington, which may be estimated, by way of non-limiting example, based on the flight path of the 727. The simulation may be displayed as a static map, as an animation, or in other styles known in the art.

Figure 8:
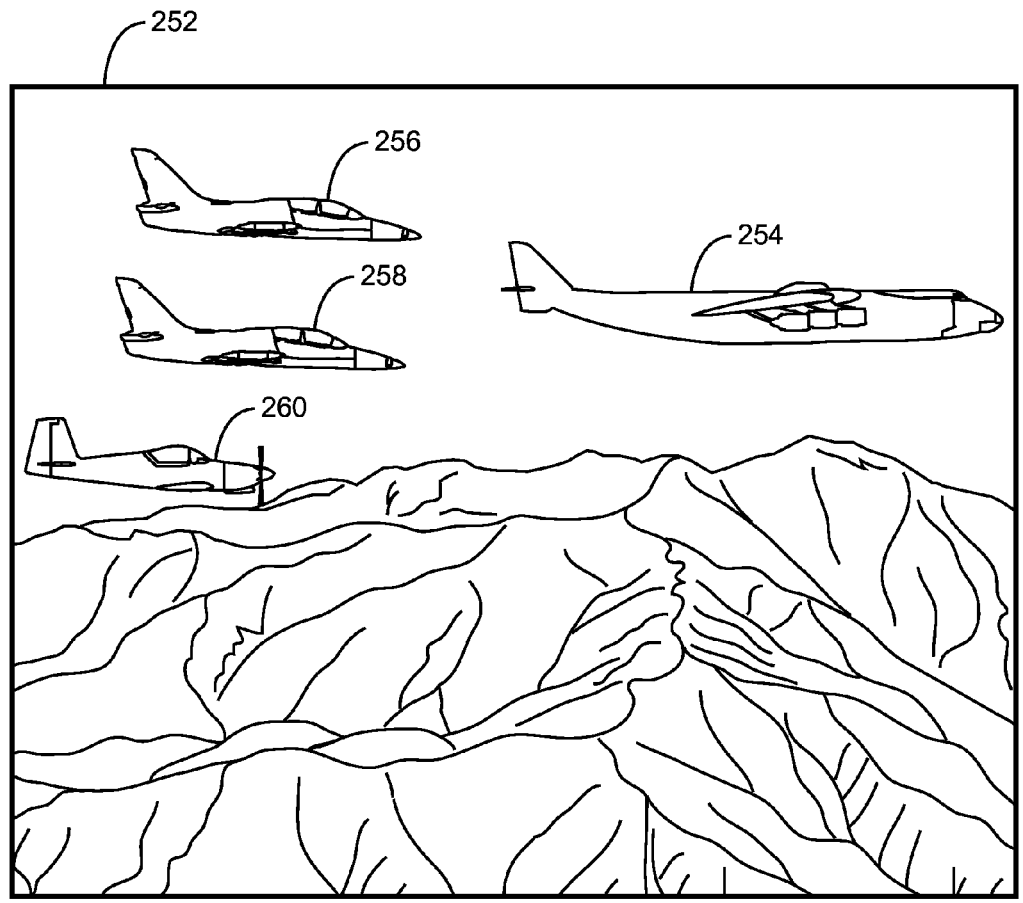
FIG. 8 illustrates a three-dimensional simulation display according to one embodiment.

FIG. 8 illustrates a simulation display 252 according to one embodiment. In this display, the 727 airliner 254 is visualized being followed by the two F-106 aircraft 256 and 258 and the T-33 Lockheed trainer 260 using simulation instructions generated from the data structure 238 of FIG. 6. Similar to the overhead map display of FIG. 7, the visualization of FIG. 8 may be displayed as a static scene, as an animation, or in other styles known in the art. In these and other embodiments, the simulation may be visualized as a three-dimensional still image, animation or moving image. In this example, the aircraft are represented by generic models of similar types of aircraft, such as an airliner, turboprop, jet fighter, etc., as discussed above.

Figure 9:
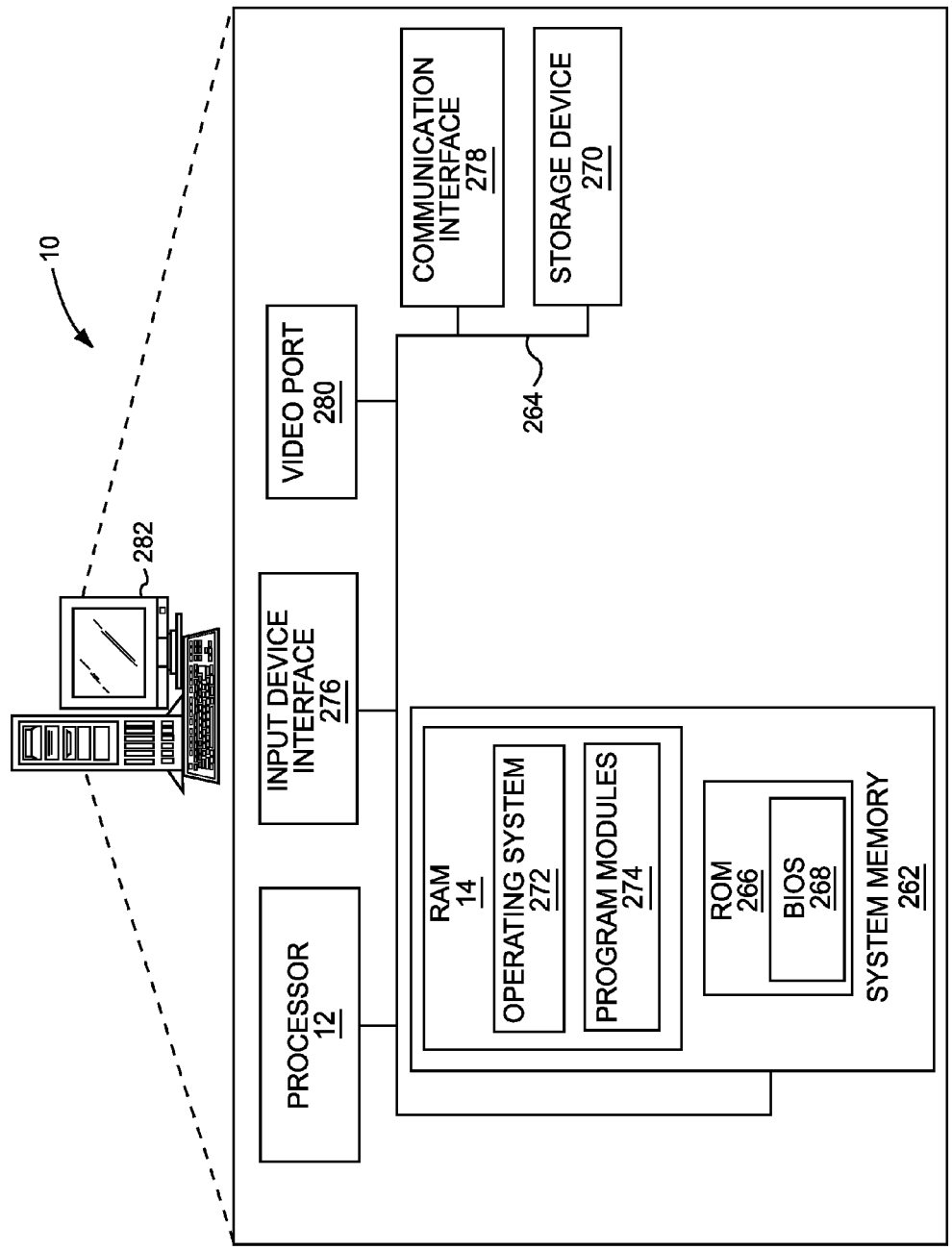
FIG. 9 is a block diagram illustrating details of the device depicted in FIG. 1 in greater detail according to one embodiment.

FIG. 9 is a block diagram illustrating the device 10 depicted in FIG. 1 in greater detail, according to one embodiment. The device 10 may comprise, by way of non-limiting example, a laptop computer, a desktop computer, a workstation, a server, or any other processing device comprising the processor 12 and be capable of implementing the functionality described herein. The processor 12 may be coupled to a system memory 262 via a system bus 264. The system bus 264 provides an interface for system components including, but not limited to, the system memory 262 and the processor 12. The processor 12 may be any of various commercially available or proprietary processors. Dual microprocessors and other multi-processor architectures may also be employed as the processor 12.

The system bus 264 may be any of several types of bus structures that may further interconnect to a memory bus (with or without a memory controller), a peripheral bus, and/or a local bus using any of a variety of commercially available bus architectures. The system memory 262 may include non-volatile memory (e.g., read only memory (ROM) 266, erasable programmable read only memory (EPROM), electrically erasable programmable read only memory (EEPROM), etc.) and/or volatile memory e.g., random access memory (RAM)).

The system memory 262 may also include the memory 14, discussed above with respect to FIG. 1. A basic input/output system (BIOS) 268 may be stored in the non-volatile memory 266, and may include the basic routines that help to transfer information between elements within the device 10. The volatile memory 14 may also include a high-speed RAM, such as static RAM, for caching data.

The device 10 may further include storage 270, which may comprise, by way of non-limiting example, an internal hard disk drive (HDD) (e.g., enhanced integrated drive electronics (EIDE) or serial advanced technology attachment (SATA)) for storage, solid-state memory, flash memory, or the like. The storage 270 and associated computer-readable and computer-usable media provide non-volatile storage of data and data structures described herein, as well as computer-executable instructions for implementing functionality described herein. Although the description of computer-readable media above refers to an HDD, it should be appreciated by those skilled in the art that other types of media which may be readable by a computer, such as floppy disks, magnetic cassettes, flash memory cards, cartridges, and the like, may also be used in the operating environment, and further, that any such media may contain computer-executable instructions for performing the novel functionality described herein.

A number of modules may be stored in the storage 270 and in the volatile memory 14, including an operating system 272 and one or more program modules 274, such as data structure generation function 16 and simulation file generation function 18 (FIG. 1), which may implement the functionality described herein in whole or in part. It is to be appreciated that the embodiments may be implemented with various commercially available operating systems 272 or combinations of operating systems 272.

All or a portion of the embodiments may be implemented as a computer program product, such as a non-transitory computer-usable or computer-readable medium having a computer-readable program code embodied therein. The computer-readable program code may include complex software instructions for implementing the functionality of the embodiments described herein when executed on the processor 12. The processor 12, in conjunction with the program modules 274 in the volatile memory 14, may serve as a controller, or as a control system, for the device 10 that may be configured to, or adapted to, implement the functionality described herein.

An administrator may be able to enter commands and information into the device 10 through one or more input devices (not illustrated), such as, by way of non-limiting example, a touch-sensitive display screen; a keyboard; or a pointing device, such as a mouse. Other input devices may include a microphone, an infrared (IR) remote control, a joystick, a game pad, a stylus pen, or the like. These and other input devices may often be connected to the processor 12 through an input device interface 276 that may be coupled to the system bus 264, but may be connected by other interfaces such as a parallel port, an IEEE 1394 serial port, a game port, a universal serial bus (USB) port, an IR interface, etc. The device 10 may also include a communication interface 278 that may be configured to communicate with a network. The device 10 may also include a video port 280 configured to drive one or more display devices 282.

As discussed above, in certain embodiments, visualization of an event based upon unstructured data obtained from an electronic source or a plurality of electronic sources on a display may be provided. Examples of a display include, but are not limited to, screens, monitors, televisions, laptop displays, head mount displays (HMDs), and any other device capable of projecting an image for visualization.

In one embodiment, visualization of a sequence of events based upon unstructured data obtained from an electronic source or a plurality of electronic sources may be applicable in military applications, wherein individuals may utilize flight simulators or other types of simulators for training purposes including, but not limited to, large scale battle simulations incorporating land, sea, air, and/or submersible vehicles. In another embodiment, visualization of a sequence of events may be applicable in training applications, wherein an end user may utilize a desktop, laptop, or other type of computing device for training purposes.

In additional embodiments, visualization of a sequence of events may be applicable in gaming and entertainment applications, security and law enforcement applications, forensic applications, news applications, historic applications, live, virtual and/or constructive simulations, or research applications.

In one embodiment, a visualization of an event may be made via a media player, an end user may increase or decrease the rate in which the event may be played on the media player, change points of view of the visualized event, reverse play of the event, or otherwise interact with a visualization of the event based upon unstructured data obtained from an electronic source or a plurality of electronic sources.

Simulation and visualization of three-dimensional virtual environments may be utilized in various devices, including, but not limited to, simulation devices and computers. Further, simulation and visualization of three-dimensional virtual environments may be utilized for various purposes and in various capacities, including, but not limited to, education, research, gaming and entertainment, virtual globe and mapping programs, and mobile device applications.

One embodiment is directed to a system for visualizing an event from unstructured data on a display at a user end, via a display that may be incorporated within a simulation device. Non-limiting examples of simulation devices include, but are not limited to, flight simulators, submarine simulators, tank simulators, and automobile simulators. In other embodiments, the display is in operable connection with an electronic device.

In one embodiment, an input/output device may be used in conjunction with a simulation device. In such manner, the input/output device may be used to control camera movements. Such movements may be based in several manners, including, but not limited to, basing movement on user input, simulated responses to the virtual environment, or by utilizing predetermined paths. The input/output device may be a keyboard, mouse, joystick, gaming controller, voice interface, touch interface, tilt interface, 3D trackers, and head-mounted displays or other means, or any combination thereof.

A media player may provide a graphical user interface to permit an end user to execute the definition file for playback on the media player. The media player may permit playback of the event in various modes including, but not limited to, accelerated mode and reverse. A non-limiting example of a media player may be a simulation application. Certain media players may also include interactive graphic and mapping capabilities, thereby permitting visualization of unstructured data in a simulated environment representative of a real world.

Those skilled in the art will recognize improvements and modifications to the preferred embodiments of the embodiments. All such improvements and modifications are considered within the scope of the concepts disclosed herein and the claims that follow.

What is claimed is:

1. A method comprising:
processing, by a processing device, a plurality of unstructured data comprising data that is arranged so as to be understood or interpreted by a human reader;
generating, by the processing device, a plurality of structured data units from the plurality of unstructured data based on the processing, each structured data unit having a time value, an identity value, a location value and a behavior value;
generating a data structure comprising a sequence of the structured data units; and
generating a simulation definition file based on the data structure, the simulation definition file containing instructions for directing a simulator to generate a visualization of the sequence of the structured data units on a display device, wherein generating the simulation definition file based on the data structure comprises:
accessing the data structure;
processing the structured data units, including, for each structured data unit:
identifying an action from at least one database based on the behavior value:
identifying a person or object from the at least one database based on the identity value;
identifying a geolocation from the at least one database based on the location value; and
identifying a time based on the time value;
generating instructions for directing the simulator to generate a visualization of the structured data units based on the identified behaviors, objects, locations and times of the structured data units; and
storing the instructions as the simulation definition file.

2. The method of claim 1, wherein each identity value identifies a person or object.

3. The method of claim 1, wherein each location value identifies a geolocation or proximity thereto.

4. The method of claim 1, wherein each behavior value identifies an action, movement, transaction or interaction.

5. The method of claim 1, wherein generating the plurality of structured data units from the plurality of unstructured data further comprises:
determining that at least one of a time value, an identity value, a location value and a behavior value for each structured data unit cannot be determined solely based on the unstructured data; and
in response to a determination that at least one of a time value, an identity value, a location value and a behavior value for each structured data unit cannot be determined solely based on the unstructured data, estimating the at least one time value, identity value, location value or a behavior value based on a secondary data source.

6. The method of claim 1, wherein the plurality of unstructured data includes data corresponding to at least one of text and human-spoken language.

7. The method of claim 1, wherein the plurality of unstructured data is obtained from an electronic source including at least one of a news article, a blog, a book, a journal, a magazine, an advertisement, metadata, a report, a health record, an audio file, a video file, a text-based file, a partially text-based file, a non-text file, a transcript, a brief, and an e-mail.

8. The method of claim 1, wherein the sequence of the structured data units comprises a chronological sequence, and further comprising:
determining the chronological sequence of the structured data units based on the time value associated with each of the plurality of structured data units.

9. The method of claim 6, wherein the plurality of unstructured data includes data corresponding to at least one of text and human spoken language prose.

10. The method of claim 9, wherein the at least one text and human spoken language prose comprises English prose.

11. An apparatus comprising:
one or more processors configured to perform the functions of:
generating a plurality of structured data units from a plurality of unstructured data, each structured data unit having a time value, an identity value, a location value and a behavior value, wherein unstructured data is data that is arranged so as to be understood or interpreted by a human reader;
generating a data structure comprising a sequence of the structured data units; and
generating a simulation definition file based on the data structure, the simulation definition file containing instructions for directing a simulator to generate a visualization of the sequence of the structured data units on a display device, wherein generating the simulation definition file based on the data structure comprises:
accessing the data structure;
processing the structured data units, including, for each structured data unit:
identifying an action from at least one database based on the behavior value;
identifying a person or object from the at least one database based on the identity value;

identifying a geolocation from the at least one database based on the location value; and
identifying a time based on the time value;
generating instructions for directing the simulator to generate a visualization of the structured data units based on the identified behaviors, objects, locations and times of the structured data units; and
storing the instructions as the simulation definition file.

12. The apparatus of claim 11, wherein each identity value identifies a person or object.

13. The apparatus of claim 11, wherein each location value identifies a geolocation or proximity thereto.

14. The apparatus of claim 11, wherein each behavior value identifies an action, movement, transaction or interaction.

15. The apparatus of claim 11, wherein generating the plurality of structured data units from the plurality of unstructured data further comprises:
   determining that at least one of a time value, an identity value, a location value and a behavior value for each structured data unit cannot be determined solely based on the unstructured data; and
   in response to a determination that at least one of a time value, an identity value, a location value and a behavior value for each structured data unit cannot be determined solely based on the unstructured data, estimating the at least one time value, identity value, location value or a behavior value based on a secondary data source.

16. A non-transitory computer readable medium storing instructions capable of instructing a processor to perform a method comprising:
   generating a plurality of structured data units from a plurality of unstructured data, each structured data unit having a time value, an identity value, a location value and a behavior value, wherein the unstructured data comprises prose;
   generating a data structure comprising a sequence of the structured data units; and
   generating a simulation definition file based on the data structure, the simulation definition file containing instructions for directing a simulator to generate a visualization of the sequence of the structured data units on a display device, wherein generating the simulation definition file based on the data structure comprises:
   accessing the data structure;
   processing the structured data units, including, for each structured data unit:
      identifying an action from at least one database based on the behavior value;
      identifying a person or object from the at least one database based on the identity value;
      identifying a geolocation from the at least one database based on the location value; and
      identifying a time based on the time value;
   generating instructions for directing the simulator to generate a visualization of the structured data units based on the identified behaviors, objects, locations and times of the structured data units; and
   storing the instructions as the simulation definition file.

17. The non-transitory computer readable medium of claim 16, wherein each location value identifies a geolocation or proximity thereto.

18. The non-transitory computer readable medium of claim 16, wherein each behavior value identifies an action, movement, transaction or interaction.

19. The non-transitory computer readable medium of claim 16, wherein generating the plurality of structured data units from the plurality of unstructured data further comprises:
   determining that at least one of a time value, an identity value, a location value and a behavior value for each structured data unit cannot be determined solely based on the unstructured data; and
   in response to a determination that at least one of a time value, an identity value, a location value and a behavior value for each structured data unit cannot be determined solely based on the unstructured data, estimating the at least one time value, identity value, location value or a behavior value based on a secondary data source.

* * * * *